United States Patent
Shibib et al.

(10) Patent No.: US 10,665,711 B2
(45) Date of Patent: May 26, 2020

(54) HIGH-ELECTRON-MOBILITY TRANSISTOR WITH BURIED INTERCONNECT

(71) Applicant: Vishay-Siliconix, San Jose, CA (US)

(72) Inventors: Ayman Shibib, San Jose, CA (US); Kyle Terrill, Santa Clara, CA (US); Yongping Ding, Santa Clara, CA (US); Jinman Yang, Santa Clara, CA (US)

(73) Assignee: VISHAY SILICONIX, LLC, San Jose, CA (US)

(*) Notice: Subject to any disclaimer, the term of this patent is extended or adjusted under 35 U.S.C. 154(b) by 0 days.

(21) Appl. No.: 16/450,513

(22) Filed: Jun. 24, 2019

(65) Prior Publication Data

US 2019/0312137 A1 Oct. 10, 2019

Related U.S. Application Data

(62) Division of application No. 15/643,328, filed on Jul. 6, 2017, now Pat. No. 10,381,473.

(Continued)

(51) Int. Cl.
*H01L 29/778* (2006.01)
*H01L 29/40* (2006.01)
(Continued)

(52) U.S. Cl.
CPC ...... *H01L 29/7787* (2013.01); *H01L 21/0254* (2013.01); *H01L 21/02381* (2013.01);
(Continued)

(58) Field of Classification Search
CPC ............. H01L 29/402; H01L 29/42312; H01L 29/42316; H01L 29/47; H01L 29/778;
(Continued)

(56) References Cited

U.S. PATENT DOCUMENTS 7,544,545 B2 6/2009 Chen et al.
7,583,485 B1 9/2009 Luo et al.
(Continued)

FOREIGN PATENT DOCUMENTS

EP 2779246 9/2014
EP 2779246 A2 9/2014
(Continued)

OTHER PUBLICATIONS

Lee, Finella; The Effects of Gate Metals on the Performance of p-GaN/AlGaN/GaN High Electron Mobility Transistors.
(Continued)

*Primary Examiner* — Matthew E Warren

(57) ABSTRACT

A high-electron-mobility transistor (HEMT) includes a substrate layer of silicon, a first contact disposed on a first surface of the substrate layer, and a number of layers disposed on a second surface of the substrate layer opposite the first surface. A second contact and a gate contact are disposed on those layers. A trench containing conducting material extends completely through the layers and into the substrate layer. In an embodiment of the HEMT, the first contact is a drain contact and the second contact is a source contact. In another embodiment of the HEMT, the first contact is a source contact and the second contact is a drain contact.

20 Claims, 4 Drawing Sheets

Related U.S. Application Data

(60) Provisional application No. 62/429,629, filed on Dec. 2, 2016.

(51) Int. Cl.
| | |
|---|---|
| *H01L 21/02* | (2006.01) |
| *H01L 29/47* | (2006.01) |
| *H01L 29/205* | (2006.01) |
| *H01L 29/20* | (2006.01) |
| *H01L 29/06* | (2006.01) |
| *H01L 29/66* | (2006.01) |
| *H01L 21/768* | (2006.01) |
| *H01L 23/535* | (2006.01) |
| *H01L 29/423* | (2006.01) |
| *H01L 29/417* | (2006.01) |
| *H01L 29/10* | (2006.01) |

(52) U.S. Cl.
CPC ...... *H01L 21/76895* (2013.01); *H01L 23/535* (2013.01); *H01L 29/0649* (2013.01); *H01L 29/0653* (2013.01); *H01L 29/2003* (2013.01); *H01L 29/205* (2013.01); *H01L 29/402* (2013.01); *H01L 29/4175* (2013.01); *H01L 29/42312* (2013.01); *H01L 29/42316* (2013.01); *H01L 29/47* (2013.01); *H01L 29/66462* (2013.01); *H01L 29/7786* (2013.01); *H01L 29/1066* (2013.01); *H01L 29/41775* (2013.01)

(58) Field of Classification Search
CPC ............. H01L 29/7786; H01L 29/7787; H01L 21/02381; H01L 21/0254
USPC .......................................... 257/190, 192, 194
See application file for complete search history.

(56) References Cited

U.S. PATENT DOCUMENTS

| | | | |
|---|---|---|---|
| 7,642,164 B1 | 1/2010 | Xu et al. | |
| 7,781,894 B2 | 8/2010 | Oikawa | |
| 7,816,764 B2 | 10/2010 | Marchand et al. | |
| 7,851,825 B2 | 12/2010 | Suh et al. | |
| 7,898,004 B2 | 3/2011 | Wu et al. | |
| 7,985,986 B2 | 7/2011 | Heikman et al. | |
| 8,039,352 B2 | 10/2011 | Mishra et al. | |
| 8,049,252 B2 | 11/2011 | Smith et al. | |
| 8,114,717 B2 | 2/2012 | Palacios et al. | |
| 8,269,019 B2 | 9/2012 | Heiser et al. | |
| 8,367,500 B1 | 2/2013 | Xu et al. | |
| 8,390,027 B2 | 3/2013 | Iwamuro | |
| 8,582,258 B1 | 11/2013 | Luo et al. | |
| 8,587,033 B1 | 11/2013 | Rieger et al. | |
| 9,083,175 B2 | 7/2015 | Rouet | |
| 9,111,754 B2 | 8/2015 | Demirlioglu et al. | |
| 9,142,543 B2 | 9/2015 | Katakura et al. | |
| 9,331,472 B2 | 5/2016 | Huang et al. | |
| 9,941,267 B2 | 4/2018 | Tsai | |
| 10,224,426 B2 | 3/2019 | Shibib et al. | |
| 2002/0020873 A1 | 2/2002 | Klodzinski | |
| 2003/0108659 A1 | 6/2003 | Bales et al. | |
| 2006/0108659 A1 | 5/2006 | Yanagihara et al. | |
| 2008/0142837 A1 | 6/2008 | Sato et al. | |
| 2008/0296618 A1 | 12/2008 | Suh et al. | |
| 2009/0065785 A1 | 3/2009 | Beach | |
| 2009/0140295 A1 | 6/2009 | Kaya et al. | |
| 2009/0166677 A1* | 7/2009 | Shibata | H01L 21/76251 257/192 |
| 2011/0101370 A1 | 5/2011 | Cheng et al. | |
| 2011/0175142 A1* | 7/2011 | Tsurumi | H01L 23/481 257/192 |
| 2011/0210337 A1 | 9/2011 | Briere | |
| 2012/0007049 A1 | 1/2012 | Jeon et al. | |
| 2012/0043586 A1 | 2/2012 | Nishimori et al. | |
| 2012/0080724 A1 | 4/2012 | Iwabuchi et al. | |
| 2013/0088280 A1 | 4/2013 | Lal et al. | |
| 2013/0153919 A1 | 6/2013 | Curatola et al. | |
| 2014/0264453 A1* | 9/2014 | Moens | H01L 29/66462 257/194 |
| 2014/0327043 A1 | 11/2014 | Kim | |
| 2015/0069615 A1 | 3/2015 | Ohno et al. | |
| 2016/0118379 A1* | 4/2016 | Padmanabhan | H01L 27/0629 257/192 |
| 2017/0357283 A1 | 12/2017 | Adachi | |
| 2018/0047719 A1 | 2/2018 | Vielemeyer et al. | |
| 2018/0151681 A1 | 5/2018 | Lavanga et al. | |
| 2018/0158942 A1 | 6/2018 | Shibib et al. | |

FOREIGN PATENT DOCUMENTS

| | | |
|---|---|---|
| JP | 2008533717 | 8/2008 |
| JP | 2014179546 | 9/2014 |
| KR | 1020140139346 | 12/2014 |

OTHER PUBLICATIONS

Mantech Conference; May 19, 2014; Denver Colorado, US.

Meneghini, Matteo; Technology and Reliability of Normally-Off GaN HEMTs with p-Type Gate; Energies, MDPI; Journal; Jan. 24, 2017; Basel, CH.

Wuerfl et al., "Rieliability issues of Gan based high voltage power devices", Microelectronics and Reliability, Elsevier Science Ltd., vol. 51, No. 9, Jul. 5, 2011, Berlin, Germany.

Wuerfl et al., "Reliability issues of Gan based high voltage power devices", Microelectronics and Reliability, Elsevier Science Ltd., vol. 51, No. 9, Jul. 5, 2011, Berlin, Germany.

\* cited by examiner

HIGH-ELECTRON-MOBILITY TRANSISTOR WITH BURIED INTERCONNECT

RELATED U.S. APPLICATIONS

This application is a continuation (divisional) application of U.S. patent application Ser. No. 15/643,328, filed Jul. 6, 2017, by A. Shibib et al., entitled "High-Electron-Mobility Transistor with Buried Interconnect," now U.S. Pat. No. 10,381,473, which claims priority to the U.S. provisional application by A. Shibib et al., entitled "High Voltage GaN-on-Silicon HEMT Device," Ser. No. 62/429,629, filed Dec. 2, 2016, both of which are hereby incorporated by reference in their entirety.

BACKGROUND

A high-electron-mobility transistor (HEMT) is a field effect transistor (FET) that incorporates a junction between two materials with different band gaps as the channel instead of a doped region as is typically the case for metal-oxide semiconductor FETs (MOSFETs). HEMTs are characterized by low on-state resistance, high breakdown voltage, and low switching losses, making them excellent power devices (e.g., power amplifiers) in, for example, wireless communication systems.

In particular, HEMTs using gallium nitride (GaN) and aluminum GaN (AlGaN) on silicon substrates are important for handling high voltages and currents at high frequencies in power electronics. GaN-based HEMTs are used more in power switching applications than other types of HEMTs as their characteristics and cost structure are proving to be very suitable for a wide range of applications.

Conventional HEMTs are planar with both their source and drain disposed at the upper surface. When the device is in its on-state, the main current flow is in the lateral direction from source to drain. The gate is also on the same surface as the source and drain. Consequently, metallization and routing for a device that can handle high currents require at least two, or more likely three, levels of metal. In addition to the loss of power due to the resistance of these metal interconnects, the interconnects create parasitic inductive and capacitive components. The resistive, capacitive, and inductive parasitics all contribute to degradation of the high frequency performance of the device, and also make it difficult to prevent oscillations in the circuit in which the device is placed when the device is switching states.

Thus, there is a need for a device that reduces parasitic interconnections due to the complicated routing of the source, gate, and drain terminals.

SUMMARY

Embodiments according to the present invention provide high-electron-mobility transistor (HEMT) devices that have current flowing substantially in the vertical direction. HEMTs according to the present invention reduce the number of parasitic interconnections and simplify routing of the source, gate, and drain terminals. In these embodiments, each cell of a device has only two terminals disposed at one (e.g., the upper) surface and a third terminal at the opposite (e.g., bottom) surface.

Vertical current-flow devices in embodiments according to the present invention advantageously include a gallium nitride (GaN) epitaxial layer that can be grown on standard available silicon substrates of at least six, eight, or 12 inches in diameter using equipment that is compatible with silicon processing, thereby reducing manufacturing costs.

Vertical current-flow devices in embodiments according to the present invention also improve breakdown voltage by reducing the electric field near the gate facing the drain, especially at the gate edge near the drain. Moreover, a vertical current-flow device in embodiments according to the present invention advantageously reduces cell pitch so that there can be more cells in a given area relative to conventional devices.

In an embodiment, an HEMT includes a substrate layer of silicon, a first contact disposed on a first surface of the substrate layer, and a number of layers disposed on a second surface of the substrate layer opposite the first surface. The layers include a buffer layer, a first layer that includes gallium (e.g., a gallium nitride layer), a two-dimensional electron gas (2DEG) layer, and a second layer that includes gallium (e.g., an aluminum gallium nitride layer). A second contact and a gate contact are disposed on those layers. A trench containing conducting material extends completely through the layers and into the substrate layer. The trench also includes an insulating layer disposed between the conducting material and some of the layers. The conducting material in the trench is in contact with the substrate layer through an opening in the insulating layer and is also in contact with the 2DEG layer and the second layer. In an embodiment, the first contact is a drain contact and the second contact is a source contact. In another embodiment, the first contact is a source contact and the second contact is a drain contact.

Thus, in embodiments according to the present invention, there are two contacts (the gate contact and either the drain or source contact) at the "top" of the aforementioned layers in the HEMT and one contact (either the source or drain contact, depending on which one is on top) at the "bottom" of the HEMT (under the substrate layer). Device structures in embodiments according to the present invention provide a number of advantages.

Because HEMTs according to the present invention have vertical structures as opposed to conventional planar or lateral structures, the number of levels of metal needed to route source, drain, and gate metal lines to their corresponding pads or terminals is reduced. Also, in HEMTs according to the present invention, a special connection (either on the integrated circuit or chip or in the package) between the silicon substrate and the appropriate electrical potential is not needed. This facilitates fabrication and also eliminates sources of resistive, capactive, and inductive parasitic components that can interfere with device performance and cause unwanted oscillations when the device is switching states.

In addition, because there are only two contacts on one surface of the device instead of three contacts, cell width is reduced, meaning that cell density can be increased (that is, more HEMTs can be placed in a given area relative to conventional, e.g., lateral or planar, structures).

These and other objects and advantages of embodiments according to the present invention will be recognized by one skilled in the art after having read the following detailed description, which are illustrated in the various drawing figures.

BRIEF DESCRIPTION OF THE DRAWINGS

The accompanying drawings, which are incorporated in and form a part of this specification, illustrate embodiments of the present invention and, together with the description, serve to explain the principles of the invention. Like numbers denote like elements throughout the drawings and specification. The figures may not be drawn to scale.

DETAILED DESCRIPTION

In the following detailed description of the present invention, numerous specific details are set forth in order to provide a thorough understanding of the present invention. However, it will be recognized by one skilled in the art that the present invention may be practiced without these specific details or with equivalents thereof. In other instances, well-known methods, procedures, components, and circuits have not been described in detail as not to unnecessarily obscure aspects of the present invention.

Some portions of the detailed descriptions that follow are presented in terms of procedures, logic blocks, processing, and other symbolic representations of operations for fabricating semiconductor devices. These descriptions and representations are the means used by those skilled in the art of semiconductor device fabrication to most effectively convey the substance of their work to others skilled in the art. In the present application, a procedure, logic block, process, or the like, is conceived to be a self-consistent sequence of steps or instructions leading to a desired result. The steps are those requiring physical manipulations of physical quantities. It should be borne in mind, however, that all of these and similar terms are to be associated with the appropriate physical quantities and are merely convenient labels applied to these quantities. Unless specifically stated otherwise as apparent from the following discussions, it is appreciated that throughout the present application, discussions utilizing terms such as "growing," "removing," "forming," "connecting," "etching," "depositing," or the like, refer to actions and processes (e.g., the flowchart 300 of FIGS. 3A and 3B) of semiconductor device fabrication.

It is understood that the figures are not necessarily drawn to scale, and only portions of the devices and structures depicted, as well as the various layers that form those structures, are shown. For simplicity of discussion and illustration, processes may be described for one or two devices or structures, although in actuality more than one or two devices or structures may be formed.

Figure 1:
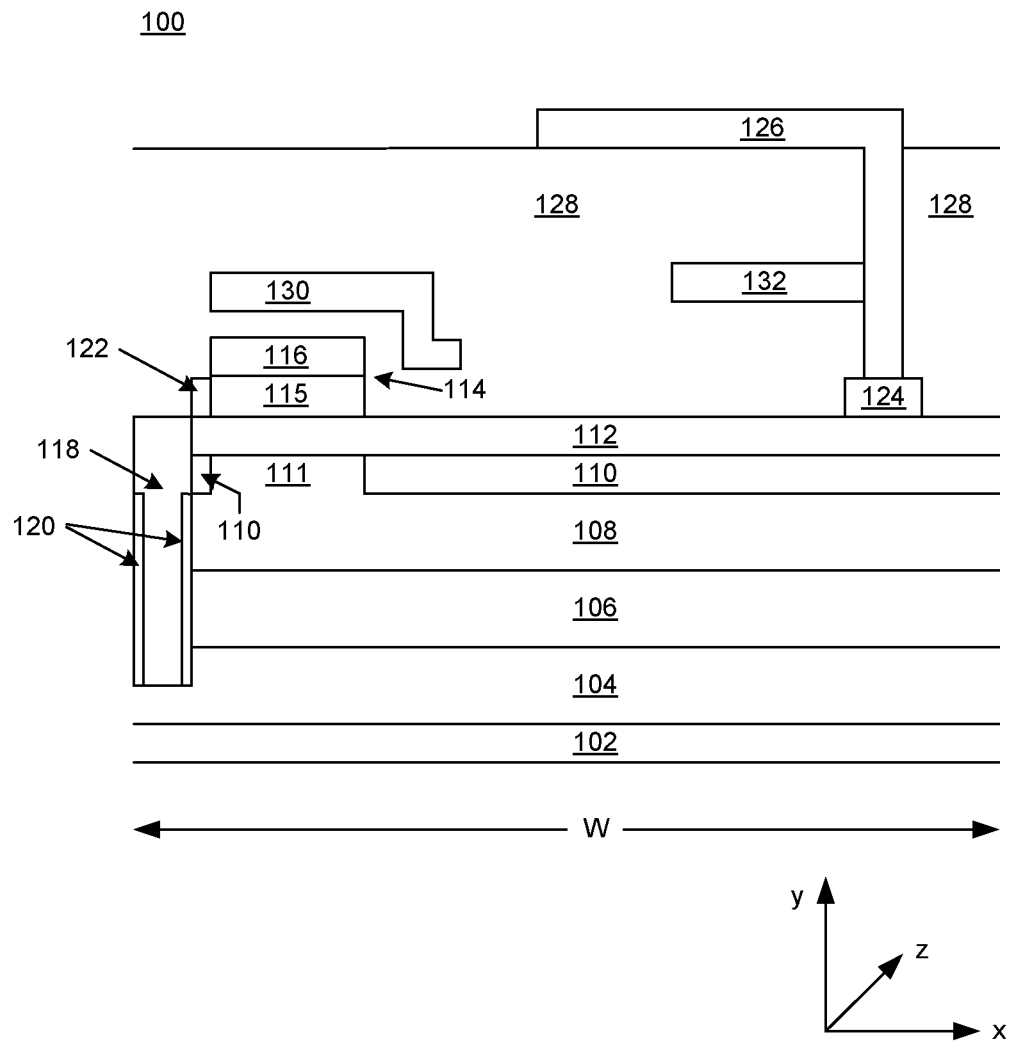
FIG. 1 is an illustration of a portion of an electronic device that includes a high-electron-mobility transistor (HEMT) in embodiments according to the present invention.

FIG. 1 is an illustration of a cross-section of a portion of an electronic device that includes a high-electron-mobility transistor (HEMT) 100 in embodiments according to the present invention. The illustrated portion may be referred to as a cell. In the FIG. 1 embodiment, the HEMT 100 includes a first contact (source contact 102) on a first surface of a silicon substrate or layer 104, and a number of layers on a second surface of the silicon layer (the second surface is opposite the first surface). The layers on the second surface of the silicon layer 104 include a buffer layer 106, a first layer 108 that includes gallium, a two-dimensional electron gas (2DEG) layer 110, and a second layer 112 that includes gallium.

In an embodiment, the first layer 108 is composed of gallium nitride (GaN) and the second layer 112 is composed of aluminum GaN (AlGaN). However, the present invention is not so limited. Materials other than GaN-based materials such as gallium arsenide (GaAs) and aluminum GaAs (AlGaAs) may be utilized in place of GaN and AlGaN, respectively.

In an embodiment, the buffer layer 106 includes aluminum nitride and alternating layers of AlGaN and GaN. The alternating layers in the buffer layer 106 may have different thicknesses.

The source contact 102 is planar as shown in FIG. 1 and is composed of source metal. The silicon layer 104 is composed of highly conductive, very low resistance silicon. In an embodiment, the resistivity of the silicon in the silicon layer 104 is less than or equal to approximately one milliohm-centimeter.

A gate contact 114 is disposed on the second layer 112. In general, the gate contact 114 extends from the second layer 112, so that it is at least partially exposed relative to the second layer. In an embodiment, the gate contact 114 includes a doped region 115 and a metal electrode 116 (an ohmic contact). In such an embodiment, the doped region 115 is composed of GaN that is doped to p-type with a p-type dopant such as, but not limited to, magnesium.

In an embodiment, the first layer 108 is in contact with the second layer 112 through an opening 111 in the 2DEG layer 110. The ends of the opening 111 are substantially aligned with the edges of the gate contact 114.

In the FIG. 1 embodiment, a second contact (drain contact 124) is also disposed on the second layer 112. In general, the drain contact 124 extends from the second layer 112, so that it is at least partially exposed relative to the second layer.

In the FIG. 1 embodiment, the HEMT 100 includes a trench 118 that may be referred to herein as a buried interconnect. The trench 118 includes an insulating layer 120 and is filled with a conducting material such as metal. The metal may be tungsten, for example. The insulating layer 120 is composed of an insulating material (e.g., a dielectric) such as silicon nitride, for example.

The trench 118 extends through the second layer 112, the 2DEG layer 110, the first layer 108, and the buffer layer 106 into the silicon layer 104. The insulating layer 120 is on the sidewalls of the trench 118 but is not on the top of the trench (at the second layer 112) or at the bottom of the trench (at the silicon layer 104).

Thus, the conducting material in the trench 118 is in direct (electrical) contact with the silicon layer 104. Thus, the trench 118 provides a path of less or least resistance between the upper surface (at the second layer 112) of the HEMT 100 and the source contact 102.

Also, the insulating layer 120 is recessed so that the second layer 112, the 2DEG layer 110, and the conducting material in the trench 118 are in direct (electrical) contact. That is, the insulating layer 120 is disposed on the sidewalls of the trench 118 only between the conducting material in the trench and the first layer 108, the buffer layer 106, and the silicon layer 104 (but not at the bottom of the trench as described above).

In an embodiment, the trench 118 is separated from the gate contact 114 by a spacer 122. The spacer 122 is composed of an insulating material and may be composed of the same insulating material used in the insulating layer 120. The spacer 122 thus isolates the gate contact 114 from the trench 118. The spacer 122 allows the gate contact 114 and the trench 118 to be fabricated as close as possible to each other (depending on the limitations of the fabrication process) without shorting the gate to the trench and source, thus reducing the cell width W.

In the FIG. 1 embodiment, the HEMT 100 includes a passivation layer 128, a first field plate 130, and a second field plate 132. Generally speaking, the field plates 130 and 132 spread out the electrical field and mitigate peaking of the electrical field at the gate edge, extending the breakdown voltage of the device. The first field plate 130 is disposed within the passivation layer 128, near the gate contact 114, and is separated from the gate contact by a portion or region of the passivation layer. A metal interconnect 126 extends from the drain contact 124 through and out of the passivation layer 128 so that it is exposed outside of the passivation layer. In the present embodiment, the second field plate 132 is disposed between the drain contact 124 and the gate contact 114 and is connected to the metal interconnect 126. Electrical connections to the gate contact 114 and to the first field plate 130 are in the z-direction.

To summarize the embodiments of FIG. 1, the HEMT 100 includes only a gate contact 114 and a drain contact 124 at the "top" surface (at or on the second layer 112) and a source contact 102 at the "bottom" surface (at or on the silicon layer 104). Consequently, source inductance, which is a major parasitic issue that can cause ringing in gate switching waveforms, is eliminated. Also, with the source contact 102 disposed at the bottom, source-to-gate metallization coupling is reduced or minimized, which significantly reduces parasitic effects.

Figure 2:
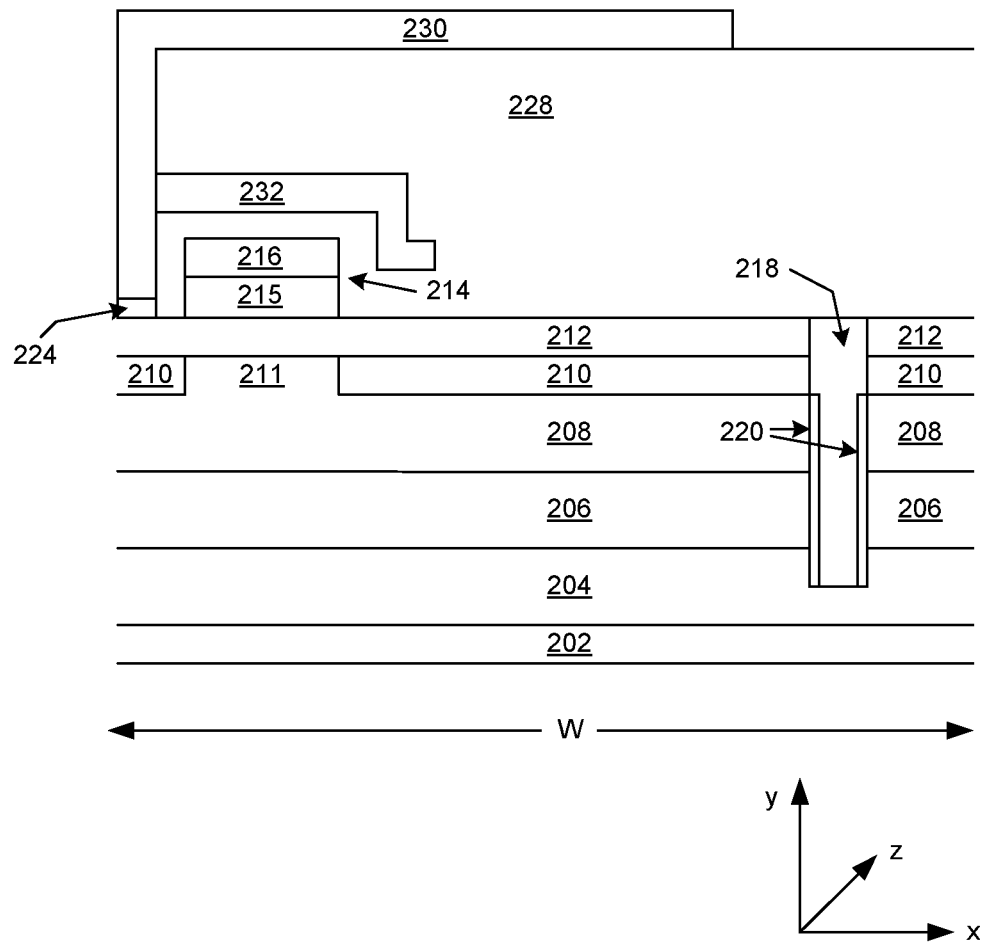
FIG. 2 is an illustration of a portion of an electronic device that includes an HEMT in embodiments according to the present invention.

FIG. 2 is an illustration of a cross-section of a portion of an electronic device that includes an HEMT 200 in embodiments according to the present invention. The illustrated portion may be referred to as a cell. In the FIG. 2 embodiment, the HEMT 200 includes a first contact (drain contact 202) on a first surface of a silicon substrate or layer 204, and a number of layers on a second surface of the silicon layer (the second surface is opposite the first surface). The layers on the second surface of the silicon layer 204 include a buffer layer 206, a first layer 208 that includes gallium, a 2DEG layer 210, and a second layer 212 that includes gallium.

In an embodiment, the first layer 208 is composed of GaN and the second layer 212 is composed of AlGaN. However, the present invention is not so limited. Materials other than GaN-based materials such as GaAs and AlGaAs may be utilized in place of GaN and AlGaN, respectively.

In an embodiment, the buffer layer 206 includes aluminum nitride and alternating layers of AlGaN and GaN. The alternating layers in the buffer layer 206 may have different thicknesses.

The drain contact 202 is planar as shown in FIG. 2 and is composed of drain metal. The silicon layer 204 is composed of highly conductive, very low resistance silicon. In an embodiment, the resistivity of the silicon in the silicon layer 204 is less than or equal to approximately one milliohm-centimeter.

A gate contact 214 is disposed on the second layer 212. In general, the gate contact 214 extends from the second layer 212, so that it is at least partially exposed relative to the second layer. In an embodiment, the gate contact 214 includes a doped region 215 and a metal electrode 216 (an ohmic contact). In such an embodiment, the doped region 215 is composed of GaN that is doped to p-type with a p-type dopant such as, but not limited to, magnesium.

In an embodiment, the first layer 208 is in contact with the second layer 212 through an opening 211 in the 2DEG layer 210. The ends of the opening 211 are substantially aligned with the edges of the gate contact 214.

In the FIG. 2 embodiment, a second contact (source contact 224) is also disposed on the second layer 212. In general, the source contact 224 extends from the second layer 212, so that it is at least partially exposed relative to the second layer.

In the FIG. 2 embodiment, the HEMT 200 includes a trench 218 that may be referred to herein as a buried interconnect. The trench 218 includes an insulating layer 220 and is filled with a conducting material such as metal. The metal may be tungsten, for example. The insulating layer 220 is composed of an insulating material (e.g., a dielectric) such as silicon nitride, for example. In an embodiment, the thickness of the insulating layer 220 is proportional to the drain voltage level.

The trench 218 extends through the second layer 212, the 2DEG layer 210, the first layer 208, and the buffer layer 206 into the silicon layer 204. The insulating layer 220 is on the sidewalls of the trench 218 but is not on the top of the trench (at the second layer 212) or at the bottom of the trench (at the silicon layer 204).

Thus, the conducting material in the trench 218 is in direct (electrical) contact with the silicon layer 204. Thus, the trench 218 provides a path of less or least resistance between the upper surface (at the second layer 212) of the HEMT 200 and the drain contact 202.

Also, the insulating layer 220 is recessed so that the second layer 21, the 2DEG layer 210, and the conducting material in the trench 218 are in direct (electrical) contact. That is, the insulating layer 220 is disposed on the sidewalls of the trench 218 only between the conducting material in the trench and the first layer 208, the buffer layer 206, and the silicon layer 204 (but not at the bottom of the trench as described above).

In the FIG. 2 embodiment, the HEMT 200 includes a passivation layer 228 and a field plate 232. Generally speaking, the field plate 232 spreads out the electrical field, mitigates peaking of the electrical field at the gate edge, and extends the breakdown voltage of the device. The field plate 232 is disposed within the passivation layer 228, near the gate contact 214, and is separated from the gate contact by a portion or region of the passivation layer. A metal interconnect 230 extends from the source contact 224 through and out of the passivation layer 228 so that it is exposed outside of the passivation layer. In the present embodiment, the field plate 232 is connected to the metal interconnect 230. Electrical connections to the gate contact 214 and the field plate 232 are in the z-direction.

To summarize the embodiments of FIG. 2, the HEMT 200 includes only a gate contact 214 and a source contact 224 at the "top" surface (at or on the second layer 212) and a drain contact 202 at the "bottom" surface (at or on the silicon layer 204). Because the drain metal is present only at the bottom of the HEMT 200, the interaction between the gate metal and the drain metal is removed and there is no capacitive coupling between the drain contact 202 and either the gate or the source. Consequently, the parasitics between the drain contact 202 (the switching terminal) and the gate and the source are reduced or minimized. This results in fewer parasitic effects like gate ringing and improves device performance.

In addition to those already mentioned, the embodiments of FIGS. 1 and 2 provide other advantages. First, because the HEMTs 100 and 200 have vertical structures as opposed to conventional lateral or planar structures, the number of levels of metal needed to route source, drain, and gate metal lines to their corresponding pads or terminals is reduced. Also, a special connection (either on the integrated circuit or chip or in the package) between the conductive silicon substrate and the appropriate electrical potential is not needed. These features facilitate fabrication and also eliminate a source of resistive, capactive, and inductive parasitic components that can interfere with device performance and cause unwanted oscillations when the device is switching states.

In addition, because there are only two contacts on one surface of the device instead of three contacts, cell width is reduced, meaning that cell density can be increased (more HEMTs can be placed in a given area relative to conventional, e.g., planar or lateral, structures).

Figure 3A:
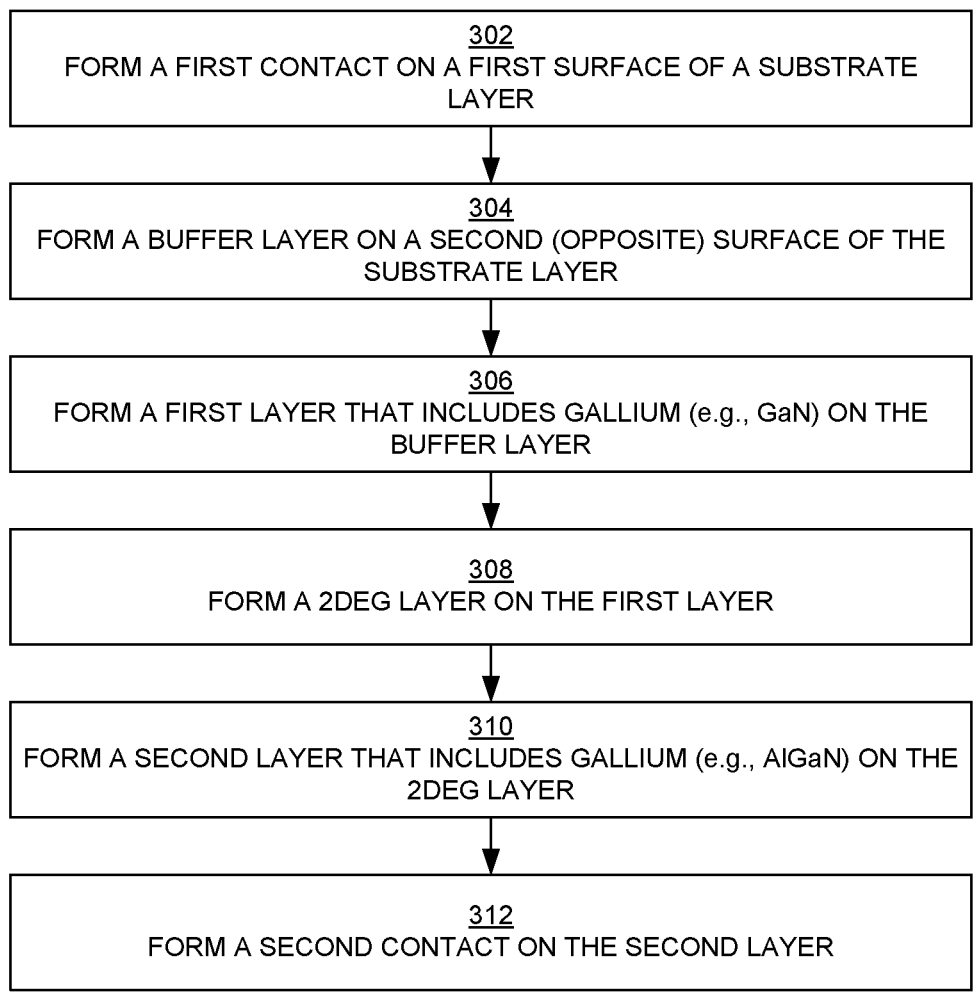
FIGS. 3A and 3B are flowcharts of an example of a method for fabricating an HEMT in embodiments according to the present invention.
Figure 3B:
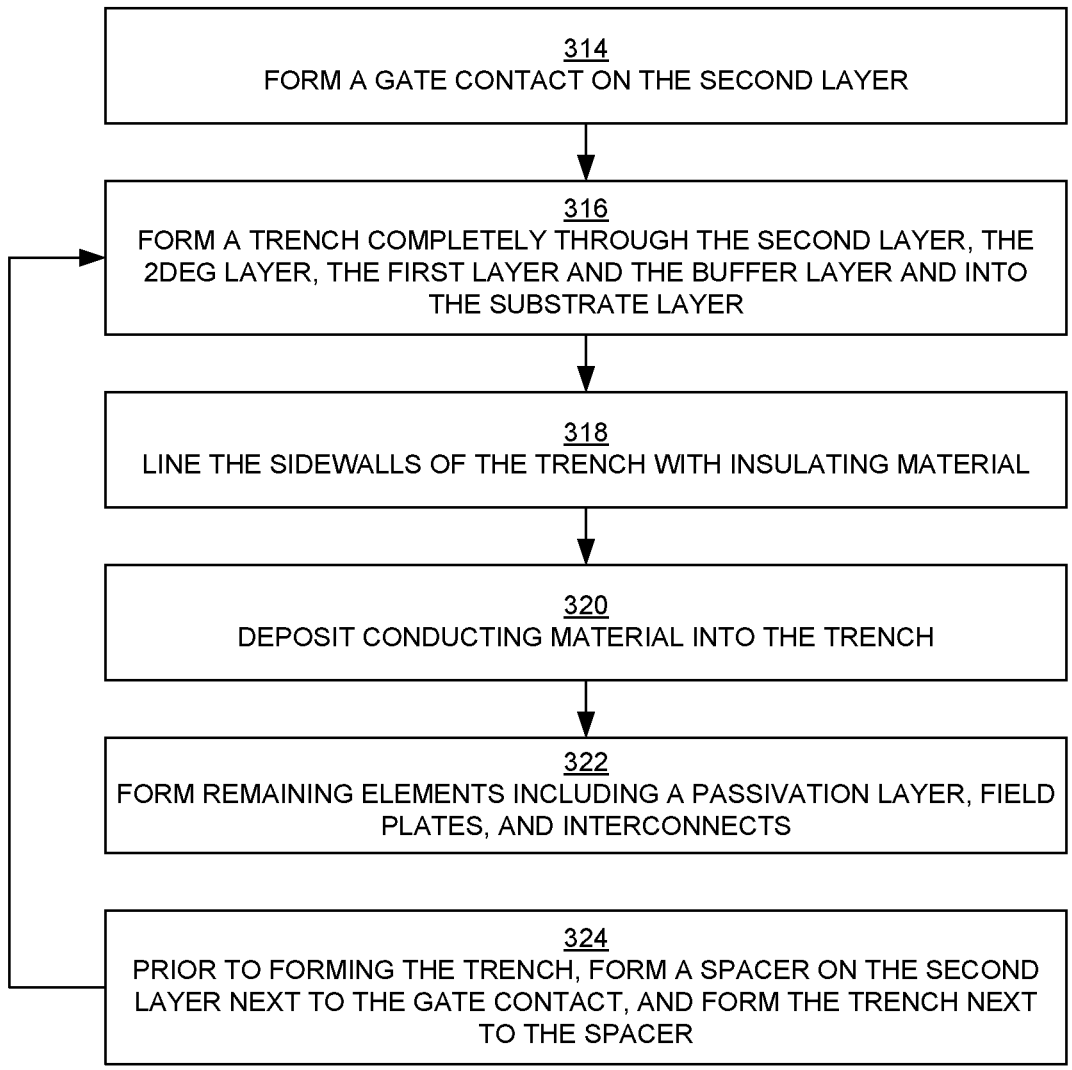

FIGS. 3A and 3B are flowcharts 300 of a method or process for fabricating a device (e.g., the HEMTs 100 and 200 of FIGS. 1 and 2, respectively) in embodiments according to the present invention. FIGS. 3A and 3B are discussed in the context of a single cell, but can be readily extended to the fabrication in parallel of multiple such cells.

In block 302 of FIG. 3A, a first contact is formed on a first surface of a substrate (silicon) layer. In the embodiment of FIG. 1, the first contact is a source contact. In the embodiment of FIG. 2, the first contact is a drain contact.

In block 304 of FIG. 3A, a buffer layer is formed on a second surface of the substrate layer, where the second surface is opposite the first surface.

In block 306, a first layer that includes gallium (e.g., GaN) is formed adjacent to the buffer layer. In an embodiment, the first layer is grown epitaxially with metal-organic chemical vapor deposition (MOCVD).

In block 308, a 2DEG layer is formed adjacent to the first layer.

In block 310, a second layer that includes gallium (e.g., AlGaN) is formed adjacent to the 2DEG layer. In an embodiment, the second layer is grown epitaxially with MOCVD.

In block 312, a second contact is formed on the second layer. In the embodiment of FIG. 1, the second contact is a drain contact. In the embodiment of FIG. 2, the second contact is a source contact.

In block 314 of FIG. 3B, a gate contact is formed on the second layer.

In block 316, a trench is formed (e.g., plasma-etched or reactive ion-etched), where the trench has sidewalls that extend completely through the second layer, the 2DEG layer, the first layer, and the buffer layer and into the substrate layer, and has a bottom within the substrate layer.

In block 318, the sidewalls of the trench (but not the bottom of the trench) are lined with an insulating material. The insulating material is disposed such that, when the trench is filled with conducting material (block 320), the conducting material in the trench is in direct contact with the second layer, with the 2DEG layer, and with the substrate layer. This can be achieved by lining the sidewalls of the trench (not including the bottom of the trench) with insulating material only to the height of the bottom of the 2DEG layer, or by lining the sidewalls of the trench (not including the bottom of the trench) with insulating material to a height above the bottom of the 2DEG layer and then removing the insulating material to the bottom of the 2DEG layer.

In block 320, conducting material is deposited into the trench.

In block 322, remaining elements of the device are formed, such as but not limited to a passivation layer, field plates, and gate, source, and drain interconnects.

In an embodiment (e.g., the embodiment of FIG. 1), in block 324, prior to forming the trench in block 314, a spacer is formed on the second layer next to the gate contact, and then the trench is formed next to the spacer. In another embodiment, the trench is formed, and a liner insulator is then deposited into the trench and etched in such a way that it leaves the spacer next to the gate contact and along the sidewalls of the trench.

In FIGS. 3A and 3B, operations described as separate blocks may be combined and performed in the same process step (that is, in the same time interval, after the preceding process step and before the next process step). Also, the operations may be performed in a different order than the order in which they are described below. Furthermore, fabrication processes and steps may be performed along with the processes and steps discussed herein; that is, there may be a number of process steps before, in between, and/or after the steps shown and described herein. Importantly, embodiments according to the present invention can be implemented in conjunction with these other (perhaps conventional) processes and steps without significantly perturbing them. Generally speaking, embodiments according to the present invention can replace portions of a conventional process without significantly affecting peripheral processes and steps.

In summary, in embodiments according to the present invention, vertical HEMTs are introduced. In these embodiments, each cell of a device has only two terminals disposed at one (e.g., the upper) surface and a third terminal at the opposite (e.g., bottom) surface. HEMTs according to the present invention reduce the number of parasitic interconnections, simplify routing of the source, gate, and drain terminals, and permit increased cell densities.

The foregoing descriptions of specific embodiments of the present invention have been presented for purposes of illustration and description. They are not intended to be exhaustive or to limit the invention to the precise forms disclosed, and many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A method of fabricating a high-electron-mobility transistor (HEMT), the method comprising:
   forming a first contact on a first surface of a substrate layer;
   forming a buffer layer on a second surface of the substrate layer, wherein the second surface is opposite the first surface;
   forming a first layer comprising gallium adjacent to the buffer layer;
   forming a second layer comprising gallium adjacent to the first layer, wherein a two-dimensional electron gas (2DEG) layer is formed within the first layer at a junction with the second layer, wherein the 2DEG layer has an opening;
   forming a second contact on the second layer;
   forming a gate contact on the second layer, wherein the opening is aligned with the gate contact;
   forming a trench that has sidewalls that extend completely through the second layer, the 2DEG layer, the first layer, and the buffer layer and into the substrate layer, wherein the trench has a bottom within the substrate layer;
   lining the sidewalls of the trench at the first layer, the buffer layer, and the first layer with an insulating material; and depositing conducting material into the trench, wherein the conducting material in the trench is in contact with the substrate layer through at the bottom of the trench and wherein the conducting material in the trench is in contact with the second layer and with the 2DEG layer.

2. The method of claim 1, wherein the first contact comprises a source contact, and wherein the second contact comprises a drain contact.

3. The method of claim 2, further comprising, prior to forming the trench, forming a spacer comprising an insulating material on the second layer next to the gate contact, wherein the trench is then formed next to the spacer.

4. The method of claim 2, further comprising:
forming a first field plate;
forming a second field plate connected to the drain contact; and
forming a passivation layer on the second layer and around the gate contact and the second contact, wherein the gate contact is separated from the first field plate by a region of the passivation layer, and wherein the first field plate and the second field plate are disposed within the passivation layer.

5. The method of claim 4, further comprising forming a metal interconnect from the drain contact through and out of the passivation layer.

6. The method of claim 1, wherein the first contact comprises a drain contact, and wherein the second contact comprises a source contact.

7. The method of claim 6, further comprising:
forming a field plate connected to the source contact; and
forming a passivation layer on the second layer and around the gate contact, wherein the gate contact is separated from the field plate by a region of the passivation layer and wherein the field plate is disposed within the passivation layer.

8. The method of claim 7, further comprising forming a metal interconnect from the source contact through and out the passivation layer.

9. The method of claim 1, wherein the first layer comprises gallium nitride (GaN) and the second layer comprises aluminum gallium nitride (AlGaN), and wherein the buffer layer comprises aluminum nitride and alternating layers of GaN and AlGaN.

10. The method of claim 1, wherein the substrate layer comprises silicon, wherein the silicon in the substrate layer has a resistivity that does not exceed one milliohm-centimeter.

11. A method of fabricating a high-electron-mobility transistor (HEMT), the method comprising:
forming a first contact on a first surface of a substrate layer;
forming a buffer layer on a second surface of the substrate layer, wherein the second surface is opposite the first surface;
forming a first layer comprising gallium adjacent to the buffer layer;
forming a second layer comprising gallium adjacent to the first layer, wherein a two-dimensional electron gas (2DEG) layer is formed within the first layer at a junction with the second layer, wherein the 2DEG layer has an opening;
forming a second contact on the second layer, wherein the first contact comprises a source contact, and wherein the second contact comprises a drain contact;
forming a gate contact on the second layer;
forming a trench that has sidewalls that extend completely through the second layer, the 2DEG layer, the first layer, and the buffer layer and into the substrate layer, wherein the trench has a bottom within the substrate layer;
lining the sidewalls of the trench at the first layer, the buffer layer, and the first layer with an insulating material;
depositing conducting material into the trench, wherein the conducting material in the trench is in contact with the substrate layer through at the bottom of the trench and wherein the conducting material in the trench is in contact with the second layer and with the 2DEG layer;
forming a first field plate;
forming a second field plate connected to the drain contact; and
forming a passivation layer on the second layer and around the gate contact and the second contact, wherein the gate contact is separated from the first field plate by a region of the passivation layer, and wherein the first field plate and the second field plate are disposed within the passivation layer.

12. The method of claim 11, further comprising forming a metal interconnect from the drain contact through and out of the passivation layer.

13. The method of claim 11, wherein the first layer comprises gallium nitride (GaN) and the second layer comprises aluminum gallium nitride (AlGaN), and wherein the buffer layer comprises aluminum nitride and alternating layers of GaN and AlGaN.

14. The method of claim 11, wherein the substrate layer comprises silicon, wherein the silicon in the substrate layer has a resistivity that does not exceed one milliohm-centimeter.

15. The method of claim 11, wherein the opening is aligned with the gate contact.

16. A method of fabricating a high-electron-mobility transistor (HEMT), the method comprising:
forming a first contact on a first surface of a substrate layer;
forming a buffer layer on a second surface of the substrate layer, wherein the second surface is opposite the first surface;
forming a first layer comprising gallium adjacent to the buffer layer;
forming a second layer comprising gallium adjacent to the first layer, wherein a two-dimensional electron gas (2DEG) layer is formed within the first layer at a junction with the second layer, wherein the 2DEG layer has an opening;
forming a second contact on the second layer, wherein the first contact comprises a drain contact, and wherein the second contact comprises a source contact;
forming a gate contact on the second layer;
forming a trench that has sidewalls that extend completely through the second layer, the 2DEG layer, the first layer, and the buffer layer and into the substrate layer, wherein the trench has a bottom within the substrate layer;
lining the sidewalls of the trench at the first layer, the buffer layer, and the first layer with an insulating material;
depositing conducting material into the trench, wherein the conducting material in the trench is in contact with the substrate layer through at the bottom of the trench and wherein the conducting material in the trench is in contact with the second layer and with the 2DEG layer;
forming a field plate connected to the source contact; and forming a passivation layer on the second layer and around the gate contact, wherein the gate contact is separated from the field plate by a region of the passivation layer and wherein the field plate is disposed within the passivation layer.

17. The method of claim 16, further comprising forming a metal interconnect from the source contact through and out the passivation layer.

18. The method of claim 16, wherein the first layer comprises gallium nitride (GaN) and the second layer comprises aluminum gallium nitride (AlGaN), and wherein the buffer layer comprises aluminum nitride and alternating layers of GaN and AlGaN.

19. The method of claim 16, wherein the substrate layer comprises silicon, wherein the silicon in the substrate layer has a resistivity that does not exceed one milliohm-centimeter.

20. The method of claim 16, wherein the opening is aligned with the gate contact.

* * * * *